(12) United States Patent
Masferrer et al.

(10) Patent No.: US 9,071,236 B1
(45) Date of Patent: Jun. 30, 2015

(54) METHOD AND SYSTEM FOR CONTROLLING A CHARGE PUMP

(71) Applicant: NXP B.V., Eindhoven (NL)

(72) Inventors: Sergio Masferrer, Eindhoven (NL); Maurits Mario Nicolaas Storms, Best (NL); Jukka Riihiaho, Vantaa (FI)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 14/138,493

(22) Filed: Dec. 23, 2013

(51) Int. Cl.
*H03K 3/017* (2006.01)
*H03K 5/04* (2006.01)
*H03K 7/08* (2006.01)
*G05F 1/10* (2006.01)
*H03K 5/156* (2006.01)

(52) U.S. Cl.
CPC .................................. *H03K 5/1565* (2013.01)

(58) Field of Classification Search
USPC ............... 327/175, 170, 172–174, 31, 34–37, 327/536, 157, 538; 363/60, 59
See application file for complete search history.

(56) References Cited

U.S. PATENT DOCUMENTS

2010/0066324 A1* 3/2010 Peng .............................. 323/282
2011/0316617 A1* 12/2011 Huang et al. ................... 327/536

* cited by examiner

*Primary Examiner* — Lincoln Donovan
*Assistant Examiner* — Thomas Skibinski

(57) ABSTRACT

Embodiments of a method for controlling a charge pump and a control device for a charge pump are described. In one embodiment, a method for controlling a charge pump involves monitoring a power-on status of the charge pump, calculating a duty cycle of the charge pump within a time period based on the power-on status of the charge pump, and adjusting at least one of a clock frequency setting and a capacitance setting of the charge pump in based on the duty cycle of the charge pump. Other embodiments are also described.

20 Claims, 7 Drawing Sheets

| STRENGTH | $K_{CLK}$ | $K_{UCAP}$ | $K_{Vout\_ripple}$ | $K_{lin\_peak}$ | $K_{lin\_avg}$ |
|---|---|---|---|---|---|
| 4 | 1 | 4 | 1 | 1 | 1 |
| 3 | 1 | 2 | 1/2 | 1/2 | 1/2 |
| 2 | 1 | 1 | 1/4 | 1/4 | 1/4 |
| 1 | 1/2 | 1 | 1/4 | 1/4 | 1/8 |
| 0 | 1/4 | 1 | 1/4 | 1/4 | 1/16 |

FIG. 5

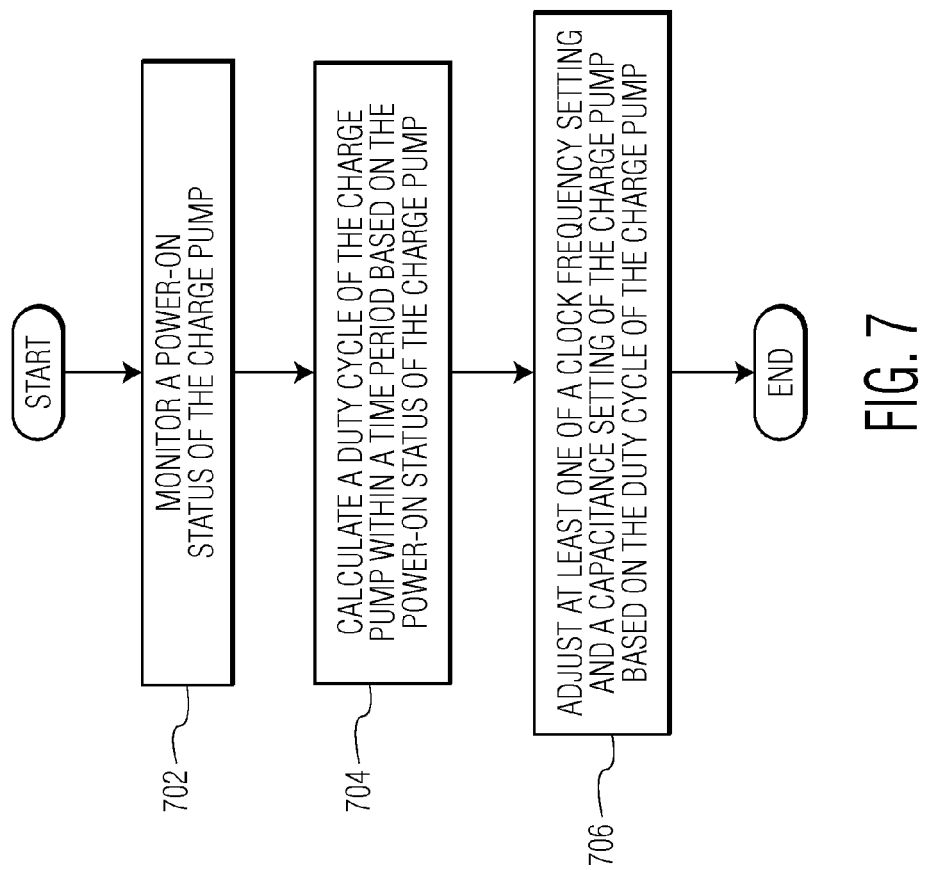

METHOD AND SYSTEM FOR CONTROLLING A CHARGE PUMP

Charge pumps are Direct Current (DC)-to-DC voltage converter circuits that can increase or decrease a voltage level provided by a voltage power source. Charge pumps are used in various applications/devices, such as memory circuits, level shifters, and battery devices. Conventional charge pumps are designed to meet prescribed specifications under worst case process, voltage, and temperature (PVT) conditions. However, under normal or best PVT conditions, the performance of conventional charge pumps can degrade. For example, the power consumption and the output current of conventional charge pumps often rise to high levels under normal or best case PVT conditions. Consequently, under normal or best case PVT conditions, conventional charge pumps suffer from high current peaks and high average currents. To deal with high current peaks and high average currents, large low ohmic power switches and large decoupling capacitors are included on substrates next to the charge pumps to stabilize the voltage supply. In some cases, additional Low-dropout regulators (LDOs) have to be used to regulate supply voltages down to acceptable levels. In addition, conventional charge pumps can suffer from high output ripples that may damage their load circuits. Therefore, there is a need for a charge pump that can perform well under various PVT conditions.

Embodiments of a method for controlling a charge pump and a control device for a charge pump are described. In one embodiment, a method for controlling a charge pump involves monitoring a power-on status of the charge pump, calculating a duty cycle of the charge pump within a time period based on the power-on status of the charge pump, and adjusting at least one of a clock frequency setting and a capacitance setting of the charge pump based on the duty cycle of the charge pump. By monitoring the power-on status of the charge pump, calculating the duty cycle of the charge pump, and adjusting the setting of the charge pump based on the duty cycle of the charge pump, the performance of the charge pump can be easily managed to adapt to various PVT conditions. Other embodiments are also described.

In one embodiment, a method for controlling a charge pump involves monitoring a power-on status of the charge pump, calculating a duty cycle of the charge pump within a time period based on the power-on status of the charge pump, and adjusting at least one of a clock frequency setting and a capacitance setting of the charge pump based on the duty cycle of the charge pump.

In one embodiment, a control device for a charge pump includes a monitor module configured to monitor a power-on status of the charge pump and a controller module configured to calculate a duty cycle of the charge pump within a time period based on the power-on status of the charge pump and to adjust at least one of a clock frequency setting and a capacitance setting of the charge pump based on the duty cycle of the charge pump.

In one embodiment, a method for controlling a charge pump involves obtaining intensity levels of clock frequency settings and capacitance settings of the charge pump where each intensity level includes a unique combination of a frequency of a clock signal that is used to drive the charge pump and a total pumping capacitance of the charge pump, calculating a duty cycle of the charge pump within a time period based on a power-on status of the charge pump, if the duty cycle of the charge pump is smaller than at least one minimum threshold, changing an intensity level of a clock frequency setting and a capacitance setting of the charge pump to a different intensity level in the intensity levels with a lower frequency of the clock signal that is used to drive the charge pump or a smaller total pumping capacitance of the charge pump, if the duty cycle of the charge pump is larger than at least one maximum threshold, changing the intensity level of the clock frequency setting and the capacitance setting of the charge pump to a different intensity level in the intensity levels with a higher frequency of the clock signal that is used to drive the charge pump or a larger total pumping capacitance of the charge pump, and if the duty cycle of the charge pump is smaller than the at least one maximum threshold and larger than the at least one minimum threshold, keeping the intensity level of the clock frequency setting and the capacitance setting of the charge pump the same.

Other aspects and advantages of embodiments of the present invention will become apparent from the following detailed description, taken in conjunction with the accompanying drawings, depicted by way of example of the principles of the invention.

FIG. 5 depicts some examples of operational parameters of the charge pump depicted in FIG. 2.

FIG. 7 is a process flow diagram that illustrates a method for controlling a charge pump in accordance with an embodiment of the invention.

Throughout the description, similar reference numbers may be used to identify similar elements.

It will be readily understood that the components of the embodiments as generally described herein and illustrated in the appended figures could be arranged and designed in a wide variety of different configurations. Thus, the following detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment. Rather, language referring to the features and advantages is understood to mean that a specific feature, advantage, or characteristic described in connection with an embodiment is included in at least one embodiment. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment. Thus, the phrases "in one embodiment," "in an embodiment," and similar language throughout this specification may, but do not necessarily, all refer to the same embodiment.

Figure 1:
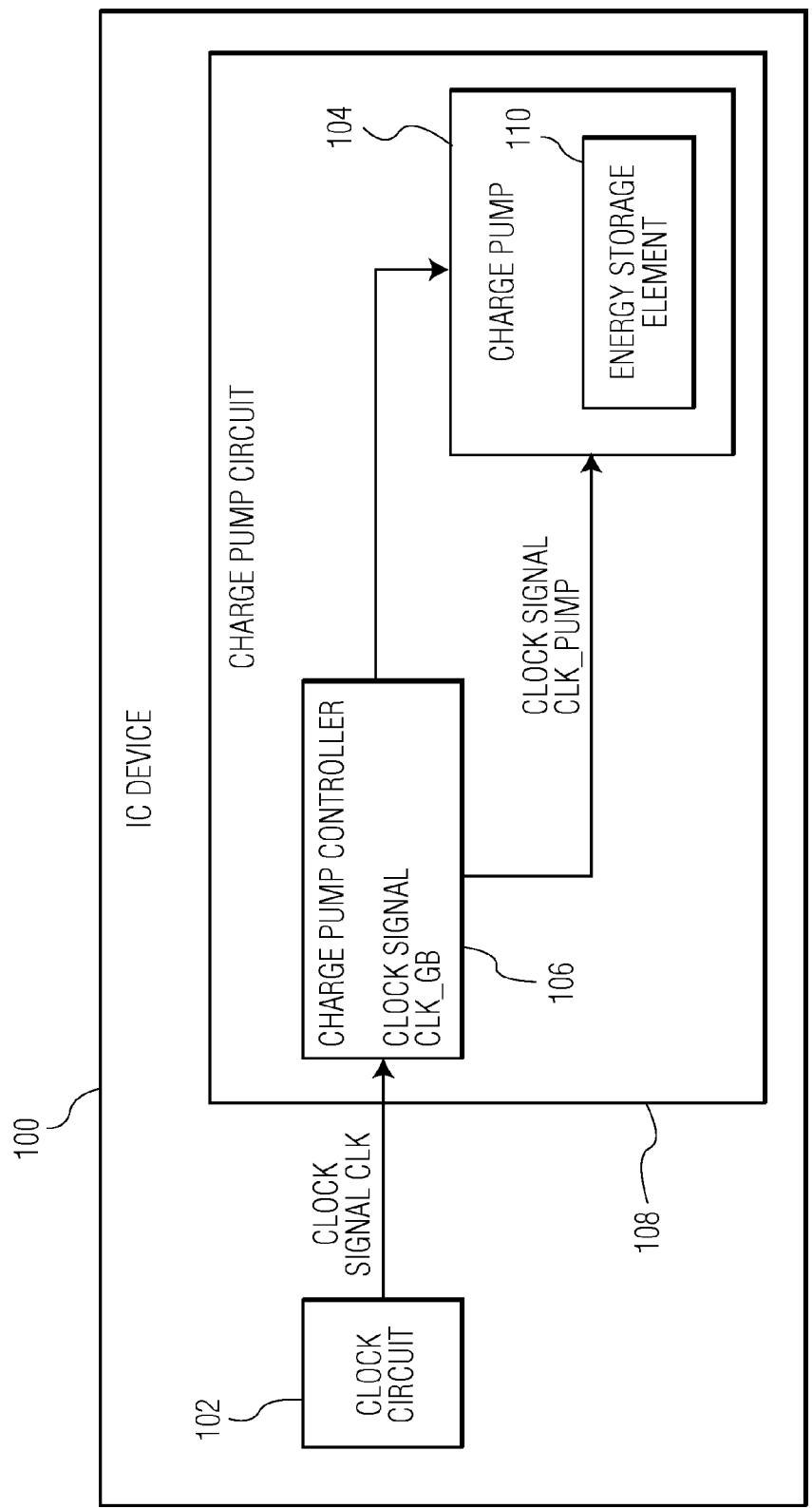
FIG. 1 is a schematic block diagram of an IC device in accordance with an embodiment of the invention.

FIG. 1 is a schematic block diagram of an IC device 100 in accordance with an embodiment of the invention. In the embodiment depicted in FIG. 1, the IC device includes a clock circuit 102, a charge pump 104, and a charge pump controller 106. The charge pump and the charge pump controller form a charge pump circuit 108. The IC device can be used in various applications, such as automotive applications, communications applications, industrial applications, medical applications, computer applications, and/or consumer or appliance applications. The IC device can be implemented in a substrate, such as a semiconductor wafer or a printed circuit board (PCB). In an embodiment, the IC device is packaged as a semiconductor IC chip. The IC device may be included in a microcontroller, which can be used for, for example, in device control, identification, and/or wireless communications. In some embodiments, the IC device is included in a memory device, such as a flash memory module. Although the IC device 100 is shown in FIG. 1 as including certain components, in some embodiments, the IC device includes less or more components to implement less or more functionalities. For example, the IC device may include memory cells or other circuit elements.

The clock circuit 102 is configured to generate a clock signal, "CLK," for the IC device 100 with a frequency, "$f_{CLK}$." The clock circuit may include a crystal oscillator or other suitable clock generator and the clock signal, "CLK," may be in the form of a square wave or other suitable waveform. In an embodiment, a clock signal, "CLK_GB," (with a frequency, "$f_{CLK\_GB}$") of the charge pump controller 106 and a clock signal, "CLK_PUMP," (with a frequency, "$f_{CLK\_Pump}$") that is used to drive the charge pump 104 are derived from the clock signal, "CLK." The clock signal, "CLK," is typically an internal clock with a frequency, "$f_{CLK}$," that changes with process, voltage, and temperature (PVT) conditions. Because the clock signal, "CLK_GB," is derived from the clock signal, "CLK," the clock time period of the clock signal, "CLK_GB," is adjusted to the changes of the clock signal, "CLK" under various PVT conditions. The frequency, "$f_{CLK\_GB}$," of the clock signal, "CLK_GB," that is used to drive the charge pump controller is typically a fraction of the frequency, "$f_{CLK}$," of the clock signal, "CLK." The frequency, "$f_{CLK\_PUMP}$," of the clock signal, "CLK_PUMP," that is used to drive the charge pump may be the same as, or a fraction of, the frequency, "$f_{CLK}$," of the clock signal, "CLK." However, in other embodiments, the clock signal, "CLK_GB," that is used to drive the charge pump controller 106 is not derived from the clock signal, "CLK," that is generated by the clock circuit 102.

The charge pump 104 is a Direct Current (DC)-to-DC voltage converter circuit that uses one or more energy storage elements 110 (e.g., capacitors) to increase or decrease a voltage level provided by a voltage power source. The charge pump typically includes one or more switching devices, such as n-channel MOSFET (NMOS) transistors or p-channel MOSFET (PMOS) transistors. A charge pump can control the charging and discharging of the energy storage elements so as to increase or decrease an input voltage of the charge pump to obtain a desired output voltage. The output voltage of the charge pump 104 may be higher than, equal to, or lower than the input voltage of the charge pump 104. The charge pump may be used to generate the power supply for a memory circuit, such as a non-volatile memory circuit, or any other suitable circuit. In an embodiment, the charge pump up converts an input voltage into a higher output voltage for a flash memory.

The charge pump controller 106 is configured to control the charge pump 104. The charge pump controller, which can also be referred to as a charge pump strength gear box, monitors the activity of the charge pump continuously and adjusts/shifts a setting of an operational parameter (e.g., at least one of a clock frequency setting and a capacitance setting) of the charge pump. For example, the charge pump controller can increase/divide the clock frequency of the charge pump (e.g., the frequency, "$f_{CLK\_PUMP}$," of the clock signal, "CLK_PUMP," that that is used to drive the charge pump) and/or the total pumping capacitance of the charge pump based on an operation status of the charge pump. By continuously monitoring the activity of the charge pump and adjusting/shifting the frequency of the charge pump clock as well as the size of the charge pump capacitance, the charge pump controller provides a continuous-time regulation loop that adapts the power and output current of the charge pump through a range of process, voltage, temperature (PVT), load capacitance and leakage current variations. In addition, the charge pump controller is self-adjustable or self-trimmed because the charge pump controller provides a continuous-time regulation loop. Consequently, no pre-calibration process is required for the charge pump controller to control the charge pump.

The activity status of the charge pump 104 may include an operation status of the charge pump, such as a power-on status of the charge pump. In some embodiments, the charge pump controller 106 monitors the power-on status of the charge pump 104 and adjusts at least one of a clock frequency setting and a capacitance setting of the charge pump based on the power-on status. In an embodiment, the power-on status of the charge pump specifies whether or not the charge pump is powered on and how long the charge pump is powered on. When the charge pump is powered on, the charge pump generates an output voltage based on an input voltage. When the charge pump is not powered on, the charge pump does not generate an output voltage. Based on the power-on status of the charge pump, the charge pump controller calculates a duty cycle of the charge pump within a time period. In some embodiments, the time period is a multiple of one clock time period of a clock signal (e.g., the clock signal, "CLK,") or one clock time period of another clock signal (e.g., the clock signal, "CLK_GB,") with a frequency that is not correlated with (e.g., the same as) the frequency of the clock signal. In an embodiment, the duty cycle of the charge pump is the percentage of time that the charge pump is in an active state (e.g., the powered-on state) as a fraction of the total time under consideration. The charge pump controller may change the frequency, "$f_{CLK\_PUMP}$," of the clock signal, "CLK_PUMP," that is used to drive the charge pump or the total pumping capacitance of the charge pump if the duty cycle of the charge pump is larger than at least one maximum threshold or smaller than at least one minimum threshold within the time period.

The charge pump controller 106 can determine an amount of time that the charge pump 104 is powered on during a time period and calculate the duty cycle of the charge pump as a ratio of the amount of time that the charge pump is powered on to the time period. In an embodiment, the charge pump controller calculates a ratio of the time period to a unit clock period. The time period may be one clock period of the clock signal, "CLK_GB," that is used to drive the charge pump controller. The unit clock period may be one clock period of the clock signal, "CLK," from the clock circuit 102. In this embodiment, for each unit clock period within the time period, the charge pump controller determines whether the charge pump is powered on and increases a counter value by one if the charge pump is powered on. The charge pump controller calculates the duty cycle as a ratio of the counter value to the clock frequency ratio. However, in other embodiments, the duty cycle of the charge pump is calculated or determined differently. The charge pump controller can change a clock frequency of the charge pump or a total pumping capacitance of the charge pump if the duty cycle of the charge pump is larger than at least one maximum threshold (one maximum threshold or a set of maximum thresholds) or smaller than at least one minimum threshold (one minimum threshold or a set of minimum thresholds) within the time period. For example, a duty cycle above the at least one maximum threshold indicates that the charge pump is too weak and a higher clock frequency or a larger total pumping capacitance needs to be set while a duty cycle below the at least one minimum threshold indicates that the charge pump is too strong and a lower clock frequency or a smaller total pumping capacitance needs to be set. The charge pump controller increases the clock frequency of the charge pump or the total pumping capacitance of the charge pump if the duty cycle of the charge pump is larger than the at least one maximum threshold and decreases the clock frequency of the charge pump or the total pumping capacitance of the charge pump if the duty cycle of the charge pump is smaller than the at least one minimum threshold.

In some embodiments, the charge pump controller 106 adjusts/shifts at least one of a frequency setting of the clock signal, "CLK_PUMP," that is used to drive the charge pump (also referred to as the clock frequency setting of the charge pump) and a capacitance setting of the charge pump 104 in a stepwise manner (i.e., step by step or setting by setting) based on an operation status of the charge pump. For example, the charge pump controller 106 can adjust a setting of the charge pump 104 in steps of fixed increments. The charge pump controller may define or obtain multiple intensity levels of clock frequency settings and capacitance settings of the charge pump. Each intensity level includes a unique combination of a clock frequency and a total pumping capacitance of the charge pump. In an embodiment, the charge pump controller calculates a duty cycle of the charge pump within a time period based on the power-on status of the charge pump and changes an intensity level of the clock frequency setting and the capacitance setting of the charge pump based on the duty cycle of the charge pump within the time period. The time period may be one clock period of the clock signal, "CLK_GB," that is used to drive the charge pump controller. The charge pump controller may change the intensity level of the clock frequency setting and the capacitance setting of the charge pump to a different intensity level in the intensity levels if the duty cycle of the charge pump is larger than at least one maximum threshold or smaller than at least one minimum threshold. For example, the charge pump controller changes a current intensity level of the clock frequency setting and the capacitance setting of the charge pump to a different intensity level in the intensity levels with a higher clock frequency of the charge pump or a larger total pumping capacitance of the charge pump if the duty cycle of the charge pump is larger than the at least one maximum threshold. The charge pump controller can change the current intensity level to a different intensity level in the intensity levels with a lower clock frequency of the charge pump or a smaller total pumping capacitance of the charge pump if the duty cycle of the charge pump is smaller than the at least one minimum threshold.

Figure 2:
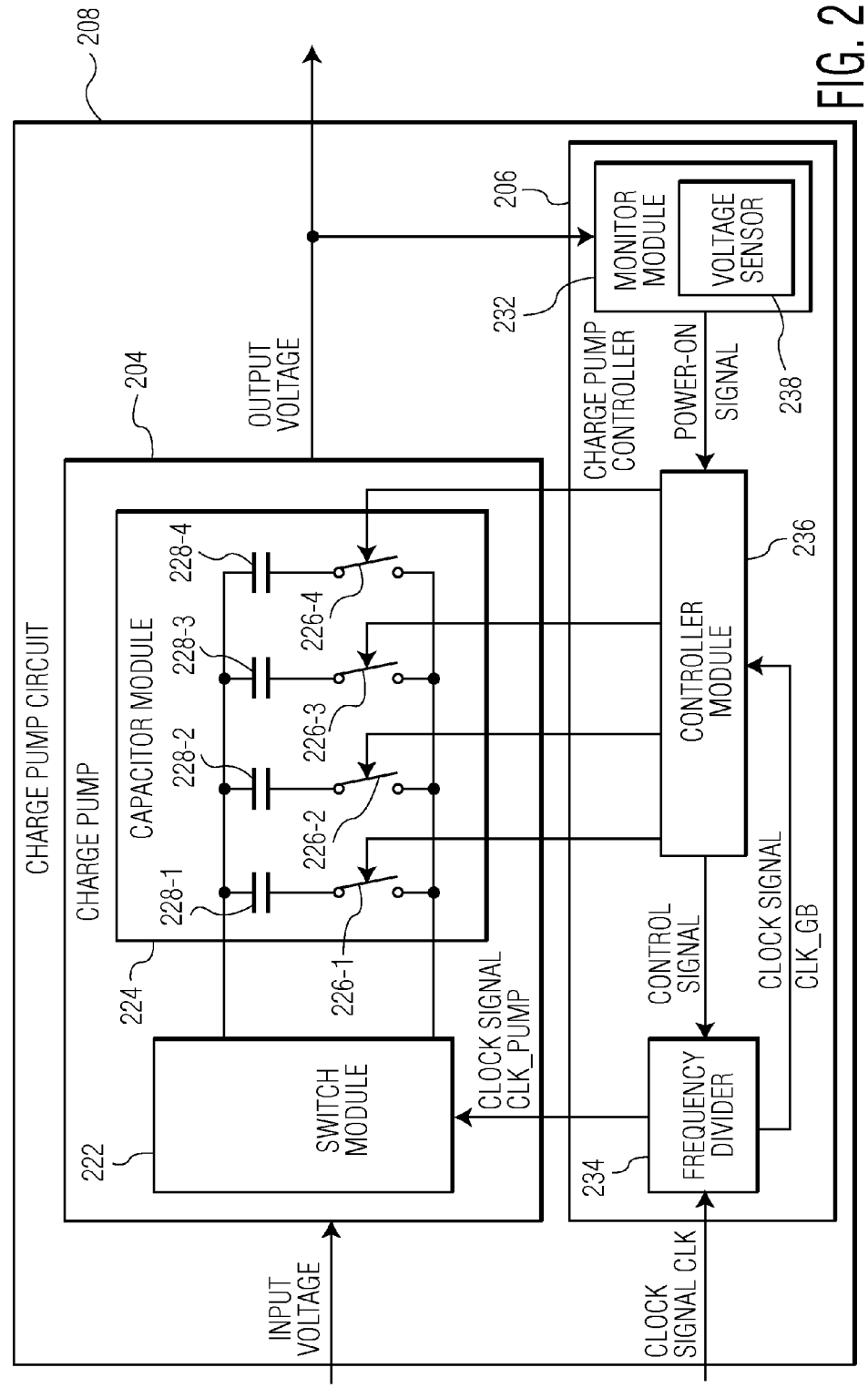
FIG. 2 depicts an embodiment of the charge pump circuit depicted in FIG. 1.

FIG. 2 depicts an embodiment of the charge pump circuit 108 depicted in FIG. 1. In the embodiment depicted in FIG. 2, a charge pump circuit 208 includes a charge pump 204 and a charge pump controller 206. The charge pump circuit 208 depicted in FIG. 2 is one possible embodiment of the charge pump circuit 108 depicted in FIG. 1. However, the charge pump circuit 108 depicted in FIG. 1 is not limited to the embodiment shown in FIG. 2.

The charge pump 204 is a DC-to-DC voltage converter circuit that includes a switch module 222 and a capacitor module/bank 224 that includes multiple capacitors 228. The switch module includes one or more switching devices, such as NMOS transistors or PMOS transistors. The switch module 222 is configured to charge or discharge the capacitors 228 in the capacitor module to generate a desired output voltage from an input voltage. The output voltage of the charge pump 204 may be higher than, equal to, or lower than the input voltage to the charge pump 204. The capacitor module can provide a variable capacitance for the charge pump 204. In the embodiment depicted in FIG. 2, the capacitor module includes four switches 226-1, 226-2, 226-3, 226-4 and four capacitors 228-1, 228-2, 228-3, 228-4 with identical capacitances. However, in other embodiments, the capacitor module may include more than four capacitors/switches or less than four capacitors/switches. In some embodiments, the capacitor module may include capacitors with different capacitances.

In the embodiment depicted in FIG. 2, the capacitors 228 of the capacitor module 224 are connected in parallel with each other. By turning on or turning off a switch 226 in the capacitor module, a corresponding capacitor 228 is enabled or disabled. For example, if only one of the switches in the capacitor module is turned on and the other three switches in the capacitor module are turned off, only one capacitor 228 in the capacitor module is enabled and the other three capacitors in the capacitor module are disabled. In this case, the capacitance of the capacitor module 224 is equal to the capacitance, "C," of one capacitor 228-1, 228-2, 228-3 or 228-4. If all of the switches in the capacitor module are turned on, all four capacitor 228 in the capacitor module are enabled. In this case, the capacitance of the capacitor module 224 is equal to ",", four times of the capacitance, "C," of one capacitor 228-1, 228-2, 228-3 or 228-4.

The charge pump controller 206 monitors the activity of the charge pump 204 and adjusts/shifts at least one setting of the charge pump. In the embodiment depicted in FIG. 2, the charge pump controller 206 includes a monitor module 232, a frequency divider 234, and a controller module 236. Although the charge pump controller 206 is shown in FIG. 2 as including certain components, in some embodiments, the charge pump controller 206 includes less or more components to implement less or more functionalities. For example, the charge pump controller 206 may include multiple frequency dividers or a combination of a frequency divider and a frequency multiplier.

The monitor module 232 monitors the power-on status of the charge pump 204 and generates a power-on status signal for the controller module 236. The monitor module may include a voltage sensor or a current sensor. In the embodiment depicted in FIG. 2, the monitor module includes a voltage sensor 238 configured to monitor the output voltage of the charge pump 204 to determine whether or not the charge pump 204 is powered on. For example, if the output voltage is higher than a predefined voltage threshold (e.g., zero) for a time period, the voltage sensor determines that the charge pump 204 is powered on in that time period.

The frequency divider 234 generates a clock signal, "CLK_GB," (with a frequency, "$f_{CLK\_GB}$") that is used to drive the controller module 236 of the charge pump controller 206 and a clock signal, "CLK_PUMP," (with a frequency, "$f_{CLK\_PUMP}$") that is used to drive the charge pump 204 from the clock signal, (with a frequency, "$f_{CLK}$,") from the clock circuit 102 (depicted in FIG. 1). The frequency, "$f_{CLK\_GB}$," of the clock signal, "CLK_GB," is typically a fraction of the frequency, "$f_{CLK}$," of the clock signal, "CLK." The frequency, "$f_{CLK\_PUMP}$," of the clock signal, "CLK_PUMP," may be the same as, or a fraction of, the frequency, "$f_{CLK}$," of the clock signal, "CLK." In some embodiments, the charge pump controller 206 may include a first frequency divider that generates the clock signal, "CLK_GB," for the controller module 236 and a second frequency divider that generates the clock signal, "CLK_PUMP," for the charge pump 204.

The controller module 236 is configured to adjust at least one of a clock frequency setting and a capacitance setting of the charge pump 204 based on the power-on status signal from the monitor module 232 by controlling the frequency divider 234 and/or the capacitor module 224 of the charge pump 204. In the embodiment depicted in FIG. 2, the controller module generates a control signal to control the frequency divider to change the frequency, "$f_{CLK\_PUMP}$," of the clock signal, "CLK_PUMP," that is used to drive the charge pump 204 or keep the frequency, "$f_{CLK\_PUMP}$," the same (unchanged). In addition, the controller module controls the capacitor module of the charge pump 204 by turning on or turning off the switches 226 to enable or disable corresponding capacitors 228.

The controller module 236 calculates a duty cycle of the charge pump 204 within a time period based on the power-on status of the charge pump 204 within the time period. In some embodiments, the controller module changes the frequency, "$f_{CLK\_PUMP}$," of the clock signal, "CLK_PUMP," that is used to drive the charge pump or the total pumping capacitance of the charge pump if the calculated duty cycle of the charge pump 204 is larger than a maximum threshold or smaller than a minimum threshold within one clock period of the clock signal, "CLK_GB," of the controller module. The controller module increases the frequency, "$f_{CLK\_PUMP}$," of the clock signal, "CLK_PUMP," that is used to drive the charge pump or the total pumping capacitance of the charge pump 204 if the calculated duty cycle is larger than the maximum threshold. The controller module decreases the frequency, "$f_{CLK\_PUMP}$," of the clock signal, "CLK_PUMP," that is used to drive the charge pump or the total pumping capacitance of the charge pump if the calculated duty cycle is smaller than the minimum threshold. For example, if the calculated duty cycle is larger than the maximum threshold, the charge pump is determined as being too weak. In this case, the controller module increases the frequency of the frequency of the clock signal, "CLK_PUMP" that is used to drive the charge pump 204 by controlling the frequency divider 234 to reduce the frequency division factor of the frequency divider or bypassing the frequency divider 234 such that the clock signal, "CLK_PUMP," of the charge pump 204 has the same frequency as the clock signal, "CLK," from the clock circuit 102. The controller module increases the total pumping capacitance of the charge pump 204 by turning on one or more switches 226 that were previously turned off to enable one or more corresponding capacitors 228. If the calculated duty cycle is smaller than the minimum threshold, the charge pump is determined as being too strong. In this case, the controller module decreases the frequency of the clock signal, "CLK_PUMP" that is used to drive the charge pump 204 by controlling the frequency divider 234 to increase the frequency division factor of the frequency divider (e.g., from 1 to 4 such that the frequency, "$f_{CLK\_PUMP}$," of the clock signal, "CLK_PUMP," reduces by 75%) or to stop bypassing the frequency divider 234 such that the clock signal, "CLK_PUMP," that is used to drive the charge pump 204 has a lower frequency than the clock signal, "CLK," from the clock circuit 102. The controller module decreases the total pumping capacitance of the charge pump 204 by turning off one or more switches 226 that were previously turned on to disable one or more corresponding capacitors 228. If the calculated duty cycle is between the minimum threshold and the maximum threshold, the controller module may keep the frequency, "$f_{CLK\_PUMP}$," of the signal, "CLK_PUMP," that is used to drive the charge pump and the total pumping capacitance of the charge pump the same (unchanged).

In some embodiments, the controller module 236 calculates a duty cycle of the charge pump 204 within one clock period of the clock signal, "CLK_GB," of the controller module. The controller module calculates a clock frequency ratio of one clock period of the clock signal, "CLK_GB," to a unit clock period, which is one clock period of the clock signal, "CLK," from the clock circuit 102. For each unit clock period within the clock period of the clock signal, "CLK_GB," the controller module can determine whether the charge pump 204 is powered on and increase a counter value by one if the charge pump 204 is powered on. The controller module calculates the duty cycle as a ratio of the counter value to the clock frequency ratio.

Figure 3:
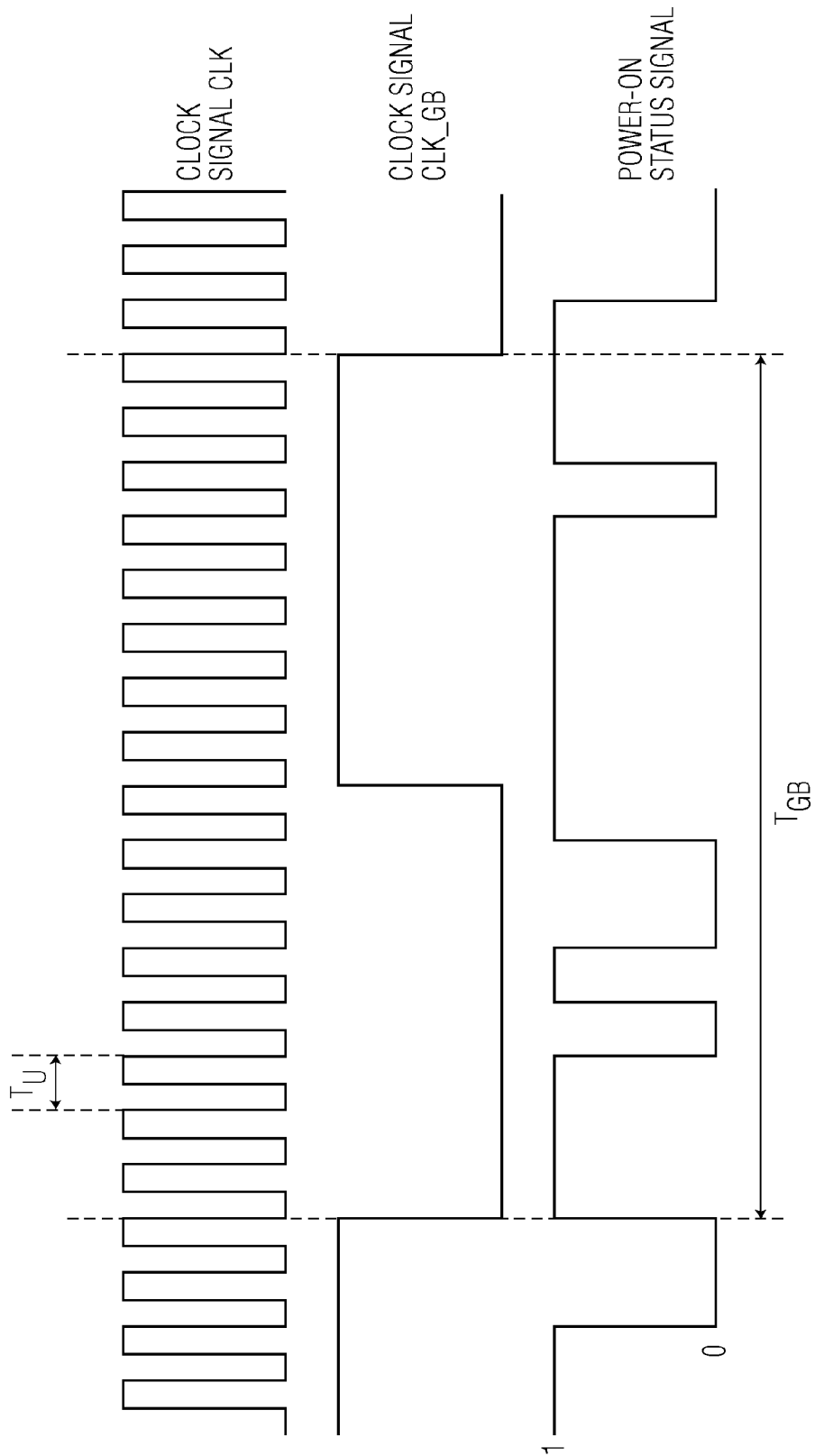
FIG. 3 depicts examples of waveforms of clock signals and a power-on status signal of the charge pump circuit depicted in FIG. 2.

An example operation of calculating a duty cycle of the charge pump 204 by the controller module 236 is described with reference to FIG. 3. Specifically, FIG. 3 depicts examples of waveforms of the input clock signal, "CLK," from the clock circuit 102, the clock signal, "CLK_GB," that is used to drive the controller module 236, and a charge pump power-on status signal from the monitor module 232. In the embodiment depicted in FIG. 3, a high edge "1" of the power-on status signal indicates that the charge pump 204 is powered-on and a low edge "0" of the power-on status signal indicates that the charge pump 204 is powered-off. As illustrated in FIG. 3, the charge pump 204 is powered on for 12 clock periods, "$T_U$," of the clock signal, "CLK." The controller module counts the number of clock periods, "$T_U$," of the clock signal, "CLK," that the charge pump 204 is powered on and incrementally increases a power-on counter value to 12. As illustrated in FIG. 3, the one clock period, "$T_{GB}$," of the clock signal, "CLK_GB," is equal to 16 times one clock period, "$T_U$," of the clock signal, "CLK." The controller module calculates a clock frequency ratio as the ratio) of one clock period, "$T_{GB}$," of the clock signal, "CLK_GB," to one clock period, "$T_U$." The controller module calculates the duty cycle of the charge pump 204 during the clock period, "$T_{GB}$," of the clock signal, "CLK_GB," as equal to the ratio of the number of clock periods, "$T_U$," of the clock signal, "CLK," that the charge pump 204 is powered on to the clock frequency ratio between the controller clock signal, "CLK_GB," and the input clock signal, "CLK." In the embodiment depicted in FIG. 3, the duty cycle of the charge pump 204 during the clock period, "$T_{GB}$," of the clock signal, "CLK_GB," is 12/16, which is equal to 75%.

Turning back to FIG. 2, the controller module 236 adjusts/shifts the frequency, "$f_{CLK\_PUMP}$," of the clock signal, "CLK_PUMP," that is used to drive the charge pump 204 and/or the total capacitance of the capacitors 228 of the capacitor module 224 the charge pump in a stepwise manner. The controller module defines or obtains multiple intensity levels (also referred to as gears) of the frequency, "$f_{CLK\_PUMP}$," and the total capacitance of the capacitor module 224. Each intensity level includes a unique combination of the frequency, "$f_{CLK\_PUMP}$," of the clock signal, "CLK_PUMP," that is used to drive the charge pump and the total capacitance of the capacitor module. For example, the controller module defines or obtains five intensity levels, including a first intensity level (Gear 0) with the frequency, "$f_{CLK\_PUMP}$," of the charge pump being equal to a quarter of the frequency, "$f_{CLK}$," of the clock signal, "CLK," and the total capacitance of the capacitor module being equal to the capacitance, "C," of one capacitor 228, a second intensity level (Gear 1) with the frequency, "$f_{CLK\_PUMP}$," being equal to half of the frequency, "$f_{CLK}$," and the total capacitance of the capacitor module being equal to the capacitance, "C," of one capacitor 228, a third intensity level (Gear 2) with the frequency, "$f_{CLK\_PUMP}$," being equal to the frequency, "$f_{CLK}$," and the total capacitance of the capacitor module being equal to the capacitance, "C," of one capacitor 228, a fourth intensity level (Gear 3) with the frequency, "$f_{CLK\_PUMP}$," being equal to the frequency, "$f_{CLK}$," and the total capacitance of the capacitor module being equal to two times of the capacitance, "C," of one capacitor 228, and a fifth intensity level (Gear 4) with the frequency, "$f_{CLK\_PUMP}$," being equal to the frequency, "$f_{CLK}$," and the total capacitance of the capacitor module being equal to four times of the capacitance, "C," of one capacitor 228.

Based on the duty cycle of the charge pump 204 within one clock period of the clock signal, "CLK_GB," of the controller module 236, the controller module changes the current intensity level of the charge pump 204 or keeps the current intensity level of the charge pump the same (unchanged). The controller module changes the intensity level of the charge pump to a different intensity level (which can be an immediately next intensity level or other suitable intensity level) if the duty cycle of the charge pump is larger than a maximum threshold or a set of maximum thresholds or smaller than a minimum threshold or a set of minimum thresholds. If the duty cycle of the charge pump is larger than the maximum threshold(s), the charge pump is determined as being too weak. In this case, the controller module changes a current intensity level of the charge pump 204 to a different intensity level (which can be an immediately next intensity level or other suitable intensity level) with a higher frequency, "$f_{CLK\_PUMP}$," or a larger total capacitance of the charge pump. For example, if the duty cycle of the charge pump is larger than the maximum threshold(s), the controller module changes the intensity level of the charge pump from Gear 1 to Gear 2 or Gear 3. If the duty cycle of the charge pump is smaller than the minimum threshold(s), the charge pump is determined as being too strong. In this case, the controller module changes the current intensity level to a different intensity level (which can be an immediately next intensity level or other suitable intensity level) with a lower frequency, "$f_{CLK\_PUMP}$," or a smaller total capacitance of the charge pump. For example, if the duty cycle of the charge pump is smaller than the minimum threshold(s), the controller module changes the intensity level of the charge pump from Gear 4 to Gear 3 or Gear 2.

One possible embodiment of a charge pump control algorithm used by the controller module 236 is described with reference to the following pseudo code. However, the charge pump control algorithm used by the controller module may be implemented with different code. The charge pump control algorithm samples the activity of the charge pump 204 during each clock period of the clock signal, "CLK_GB," of the controller module 236. The frequency, "$f_{CLK\_GB}$," of the clock signal, "CLK_GB," that is used to drive the controller module is generally a fraction of the frequency, "$f_{CLK\_PUMP}$," of the clock signal, "CLK_PUMP," that is used to drive the charge pump. In the pseudo code, the frequency, "$f_{CLK\_PUMP}$," of the clock signal, "CLK_PUMP," that is used to drive the charge pump 204 is defined as:

$$f_{CLK\_PUMP} = f_{CLK} \times K_{CLK}, \quad (1)$$

where $f_{CLK}$ represents the frequency of the clock signal, "CLK," and, "$K_{CLK}$," represents the frequency ratio of the frequency of the clock signal, "CLK_PUMP," to the frequency of the clock signal, "CLK." In addition, in the pseudo code, the capacitance coefficient, "$K_{CAP}$," of the charge pump capacitance is equal to the ratio of the current charge pump capacitance to the maximum capacitance of the capacitors 228 of the capacitor module 224. As an example, the capacitance coefficient, "$K_{CAP}$," of 0.25 means that the total charge pump capacitance is one fourth (¼) of the maximum capacitance of the capacitor module (e.g., only one of the four capacitors 228 is enabled in the capacitor module).

Charge Pump strength Gear Box

```
1   K_CLK=0.25;         //f_CLK_PUMP is initially set to the minimum frequency
2   K_CAP=0.25;         //charge pump capacitor is initially set to the
3                       //smallest size
4   gear=0;             //the gear is set to the weakest as a starting point
5   Non=0;              //Non counts how many CLK cycles the pump is
6                       //active during one clock period of CLK_GB
7   N_GB=f_CLK/f_CLK_GB; //N_GB is the clock frequency ratio of CLK to
8                        //CLK_GB
9   DClow_th=0.32;      //this duty cycle threshold defines when the
10                      //pump is considered to be too strong
11  DChigh_th=0.87;     //this duty cycle threshold defines when the
12                      //pump is considered to be too weak
13  @always(T_U_CLK)
14  if(pump_on=1) Non++;  //if charge pump is on, increase Non by 1
15  @always(T_GB_CLK_GB) begin
16  DC=Non/N_GB;          // every CLK_GB period the duty cycle of
17                        //the charge pump is calculated as the ratio between Non and N_GB
18  if(DC<DClow_th &&gear>0);   //the pump is too strong
19  gear--;                      //shift gear down by 1
20  else if(DC>DChigh_th &&gear<4);   //the pump is too weak
21  gear++;                      //shift gear up by 1
22  Non=0;                       //reset Non at the end of a CLK_GB period
23  case (gear) begin
24        4: K_CLK=1.00;   K_CAP=1.00; //strongest gear
25        3: K_CLK=1.00;   K_CAP=0.50;
26        2: K_CLK=1.00;   K_CAP=0.25;
27        1: K_CLK=0.5;    K_CAP=0.25;
28        0: K_CLK=0.25;   K_CAP=0.25; //weakest gear
29  end
```

In the above-provided pseudo code, the frequency ratio, "$K_{CLK}$," and the capacitance coefficient, "$K_{CAP}$," are initially set to minimum values, the gear/intensity level, "gear," of the charge pump 204 and a power-on counter value, "Non," are initially set to 0, and maximum and minimum thresholds, "DChigh_th," "DClow_th," of the duty cycle of the charge pump are set. The frequency ratio, "$N_{GB}$," between the input clock signal, "CLK," and the controller clock signal, "CLK_GB," is calculated. Five gears/intensity levels (0, 1, 2, 3, 4) of the charge pump with different combinations of the frequency ratio, "$K_{CLK}$," and the capacitance coefficient, "$K_{CAP}$," are defined. Gear/intensity level 4 is considered the strongest gear in the five gears with a frequency ratio, "$K_{CLK}$"

of 1 and a capacitance coefficient, "$K_{CAP}$," of 1. Gear/intensity level 0 is considered the weakest gear in the five gears with a frequency ratio, "$K_{CLK}$" of 0.25 and a capacitance coefficient, "$K_{CAP}$," of 0.25. Although the pseudo code includes 5 gears/intensity levels of the charge pump, in other embodiments, the number of required gears/intensity levels of the charge pump may be large than or smaller than 5.

Within each clock period of the clock signal, "CLK," the power-on counter value, "Non," is increased by one if the charge pump is powered on (i.e., pump on value being 1). At the end or the beginning of each clock period of the controller clock signal, "CLK_GB," the duty cycle, "DC," of the charge pump is calculated and the gear/intensity level of the charge pump is kept the same or shifted up/down depending on the duty cycle. Within one clock period of the controller clock signal, "CLK_GB," the duty cycle, "DC," of the charge pump is calculated as the ratio of the power-on counter value, "Non," to the frequency ratio, "$N_{GB}$." If the duty cycle, "DC," of the charge pump is smaller than the minimum threshold, "DClow_th" and the gear/intensity level, "gear," of the charge pump is higher than 0, the current gear/intensity level, "gear," of the charge pump is decreased/down shifted by 1. If the duty cycle, "DC," of the charge pump is larger than the maximum threshold, "DChigh_th" and the gear/intensity level, "gear," of the charge pump is lower than 4, the current gear/intensity level, "gear," of the charge pump is increased/up shifted by 1. As the gear/intensity level is shifted/held, the frequency of the clock signal that is used to drive the charge pump and the charge pump capacitance are adapted through the frequency ratio, "$K_{CLK}$," and the capacitance coefficient, "$K_{CAP}$." The power-on counter value, "Non," is reset to 0 at the end of a clock period of the controller clock signal, "CLK_GB."

Figure 4:
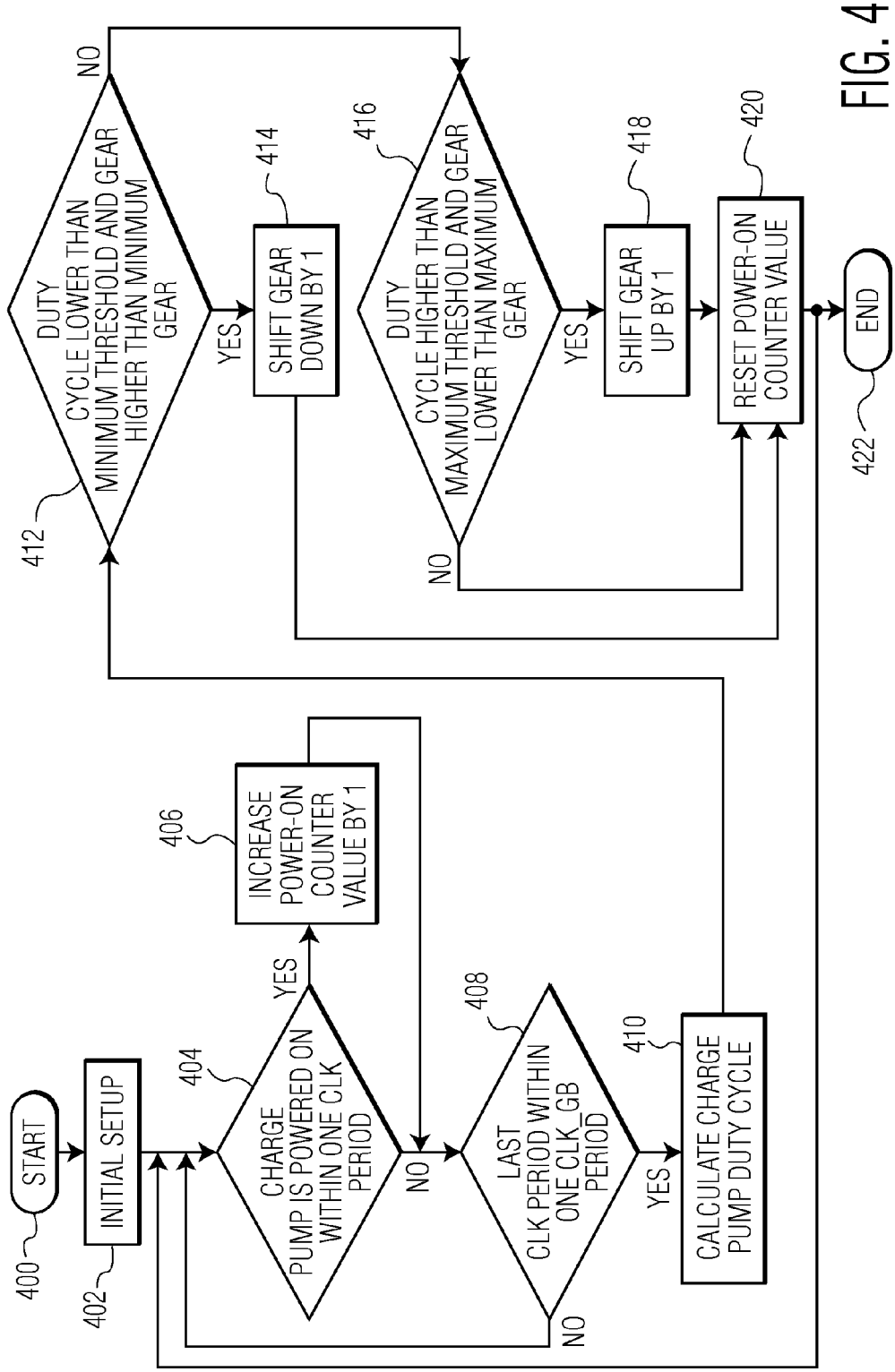
FIG. 4 is a flow chart that illustrates an operation of the controller module depicted in FIG. 2.

FIG. 4 is a flow chart that illustrates an operation of a charge pump control algorithm used by the controller module 236 depicted in FIG. 2. The controller module begins operation, at step 400. At step 402, the controller module performs initial setup. The controller module checks whether the charge pump 204 is powered on within each clock period of the input clock signal, "CLK," from the clock circuit 102 of one clock period of the controller clock signal, "CLK_GB," at step 404. If the charge pump 204 is powered on, the controller module increases a power-on counter value by 1, at step 406. If the charge pump 204 is powered off or after the power-on counter value is increased, the controller module checks whether the current clock period of the input clock signal, "CLK," from the clock circuit 102 is the last one in the clock period of the controller clock signal, "CLK_GB," at step 408. If the current clock period of the input clock signal, "CLK," from the clock circuit 102 is the last clock period within the clock period of the controller clock signal, "CLK_GB," the controller module calculates the duty cycle of the charge pump in the clock period of the controller clock signal, "CLK_GB," at step 410. The controller module checks whether the duty cycle is lower than a minimum threshold and the current gear/intensity level of the charge pump is higher than a minimum gear/intensity level, at step 412. If the duty cycle is lower than the minimum threshold and the current gear/intensity level of the charge pump is higher than the minimum gear/intensity level, the controller module decreases/shifts down the current gear/intensity level of the charge pump by 1, at step 414. Otherwise, the controller module checks whether the duty cycle is higher than a maximum threshold and the current gear/intensity level of the charge pump is lower than a maximum gear/intensity level, at step 416. If the duty cycle is higher than the maximum threshold and the current gear/intensity level of the charge pump is lower than the maximum gear/intensity level, the controller module increases/shifts up the current gear/intensity level of the charge pump by 1, at step 418. Subsequently, the controller module resets power-on counter value to zero, at step 420 and goes back to step 404 to repeat the process of adjusting the setting of the charge pump. The controller module ceases operation, at step 422.

FIG. 5 depicts some examples of operational parameters at different gears/intensity levels of the charge pump 204 depicted in FIG. 2. In the embodiment depicted in FIG. 5, five gears/intensity levels (0, 1, 2, 3, 4) of the charge pump with different combinations of the frequency ratio, "$K_{CLK}$" and a normalized capacitance coefficient, "$K_{UCAP}$," are defined. Gear/intensity level 4 is considered the strongest gear in the five gears with a frequency ratio, "$K_{CLK}$" of 1 and a uniform capacitance coefficient, "$K_{UCAP}$," of 4. Under gear/intensity level 4, normalized output voltage ripple, "KVout_ripple," average input current, "KIin_avg," input current peak, "KIin_peak," of the charge pump are equal to 1. Gear/intensity level 0 is considered the weakest gear in the five gears with a frequency ratio, "$K_{CLK}$" of 0.25 and a normalized capacitance coefficient, "$K_{uCAP}$," of 1. Under gear/intensity level 0, normalized output voltage ripple, "KVout_ripple," average input current, "KIin_avg," input current peak, "KIin_peak," are equal to ¼, ¹⁄₁₆, ¼, respectively. Consequently, the output voltage ripple, "KVout_ripple," average input current, "KIin_avg," input current peak, "KIin_peak," of the charge pump can be attenuated by the charge pump controller 206. The charge pump controller adapts the strength of the charge pump for PVT conditions, load capacitance and leakage currents and reduces output voltage ripples as well as current peaks. Using the charge pump controller, the average input current consumption of the charge pump can be as low as 4 milli-ampere (mA). Consequently, compared to a conventional charge pump that requires a power switch and a decoupling capacitor of large dimensions, the charge pump 204 only needs a small decoupling capacitor and a small power switch. In addition, the charge pump 204 does not need an additional Low-dropout regulator (LDO) to regulate voltage supply to acceptable levels.

Figure 6:
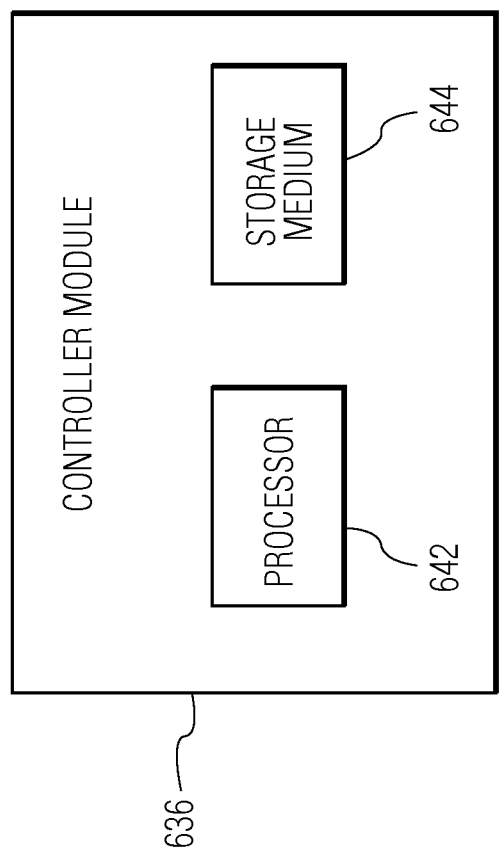
FIG. 6 depicts an embodiment of the controller module depicted in FIG. 2.

FIG. 6 depicts an embodiment of the controller module 236 depicted in FIG. 2. In the embodiment depicted in FIG. 6, a controller module 636 includes a processor 642 and a storage medium 644 that store instructions (e.g., programming codes) to be executed by the processor. The processor may be a multifunction processor and/or an application-specific processor. The processor can be a microprocessor such as a central processing unit (CPU) that provides microinstruction and data processing capability for the charge pump controller 206. The storage medium can be an electronic, magnetic, optical, electromagnetic, infrared, or semiconductor system (or apparatus or device), or a propagation medium. Examples of the storage medium include a semiconductor or solid state memory, magnetic tape, a random access memory (RAM), a read-only memory (ROM), and flash memory. The controller module 636 depicted in FIG. 6 is one possible embodiment of the controller module 236 depicted in FIG. 2. However, the controller module 236 depicted in FIG. 2 is not limited to the embodiment shown in FIG. 6.

FIG. 7 is a process flow diagram that illustrates a method for controlling a charge pump in accordance with an embodiment of the invention. The charge pump may be the same as or similar to the charge pump 104 depicted in FIG. 1 and/or the charge pump 204 depicted in FIG. 2. At block 702, a power-on status of the charge pump is monitored. At block 704, a duty cycle of the charge pump within a time period is calculated based on the power-on status of the charge pump. At block 706, at least one of a clock frequency setting and a capacitance setting of the charge pump is adjusted based on the duty cycle of the charge pump.

Although the operations of the method herein are shown and described in a particular order, the order of the operations of the method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

In addition, although specific embodiments of the invention that have been described or depicted include several components described or depicted herein, other embodiments of the invention may include fewer or more components to implement less or more features.

Furthermore, although specific embodiments of the invention have been described and depicted, the invention is not to be limited to the specific forms or arrangements of parts so described and depicted. The scope of the invention is to be defined by the claims appended hereto and their equivalents.

What is claimed is:

1. A method for controlling a charge pump, the method comprising:
   monitoring a power-on status of the charge pump;
   calculating a duty cycle of the charge pump within a time period based on the power-on status of the charge pump; and
   adjusting at least one of a clock frequency setting and a capacitance setting of the charge pump based on the duty cycle of the charge pump.

2. The method of claim 1, wherein the time period is a multiple of one clock time period of a clock signal.

3. The method of claim 1, wherein the time period is one clock time period of a first clock signal with a frequency that is not correlated with the frequency of a second clock signal.

4. The method of claim 1, wherein calculating the duty cycle of the charge pump based on the power-on status comprises:
   determining an amount of time that the charge pump is powered on during the time period; and
   calculating the duty cycle as a ratio of the amount of time that the charge pump is powered on to the time period.

5. The method of claim 1, wherein adjusting the at least one of the clock frequency setting and the capacitance setting of the charge pump comprises changing a frequency of a clock signal that is used to drive the charge pump or a total pumping capacitance of the charge pump if the duty cycle of the charge pump is larger than at least one maximum threshold or smaller than at least one minimum threshold within the time period.

6. The method of claim 5, wherein changing the frequency of the clock signal that is used to drive the charge pump or the total pumping capacitance of the charge pump comprises:
   increasing the frequency of the clock signal that is used to drive the charge pump or the total pumping capacitance of the charge pump if the duty cycle of the charge pump is larger than the at least one maximum threshold; and
   decreasing the frequency of the clock signal that is used to drive the charge pump or the total pumping capacitance of the charge pump if the duty cycle of the charge pump is smaller than the at least one minimum threshold.

7. The method of claim 1, further comprising:
   defining or obtaining a plurality of intensity levels of clock frequency settings and capacitance settings of the charge pump, wherein each intensity level comprises a unique combination of a frequency of a clock signal that is used to drive the charge pump and a total pumping capacitance of the charge pump.

8. The method of claim 7, wherein adjusting the at least one of the clock frequency setting and the capacitance setting of the charge pump comprises:
   changing an intensity level of the clock frequency setting and the capacitance setting of the charge pump based on the duty cycle of the charge pump within the time period.

9. The method of claim 8, wherein changing the intensity level of the clock frequency setting and the capacitance setting of the charge pump further comprises changing the intensity level of the clock frequency setting and the capacitance setting of the charge pump to a different intensity level in the intensity levels if the duty cycle of the charge pump is larger than at least one maximum threshold or smaller than at least one minimum threshold.

10. The method of claim 7, wherein adjusting the at least one of the clock frequency setting and the capacitance setting of the charge pump comprises:
   if the duty cycle of the charge pump is larger than at least one maximum threshold, changing a current intensity level of the clock frequency setting and the capacitance setting of the charge pump to a different intensity level in the intensity levels with a higher frequency of the clock signal that is used to drive the charge pump or a larger total pumping capacitance of the charge pump; and
   if the duty cycle of the charge pump is smaller than at least one minimum threshold, changing the current intensity level to a different intensity level in the intensity levels with a lower frequency of the clock signal that is used to drive the charge pump or a smaller total pumping capacitance of the charge pump.

11. A control device for a charge pump, the control device comprising:
   a monitor module configured to monitor a power-on status of the charge pump; and
   a controller module configured to calculate a duty cycle of the charge pump within a time period based on the power-on status of the charge pump and to adjust at least one of a clock frequency setting and a capacitance setting of the charge pump based on the duty cycle of the charge pump.

12. The control device of claim 11, wherein the time period is a multiple of one clock time period of a clock signal.

13. The control device of claim 11, wherein the time period is one clock time period of a first clock signal with a frequency that is not correlated with the frequency of a second clock signal.

14. The control device of claim 11, wherein the controller module is further configured to change a frequency of a clock signal that is used to drive the charge pump or a total pumping capacitance of the charge pump if the duty cycle of the charge pump is larger than at least one maximum threshold or smaller than at least one minimum threshold within the time period.

15. The control device of claim 11, wherein the controller module is further configured to:
   define or obtain a plurality of intensity levels of clock frequency settings and capacitance settings of the charge pump, wherein each intensity level comprises a unique combination of a frequency of a clock signal that is used to drive the charge pump and a total pumping capacitance of the charge pump.

16. The control device of claim 15, wherein the controller module is further configured to:

change an intensity level of the clock frequency setting and the capacitance setting of the charge pump based on the duty cycle of the charge pump within the time period.

17. The control device of claim 16, wherein the controller module is further configured to change the intensity level of the clock frequency setting and the capacitance setting of the charge pump to a different intensity level in the intensity levels if the duty cycle of the charge pump is larger than at least one maximum threshold or smaller than at least one minimum threshold.

18. The control device of claim 15, wherein the controller module is further configured to:
   if the duty cycle of the charge pump is larger than at least one maximum threshold, change a current intensity level of the clock frequency setting and the capacitance setting of the charge pump to a different intensity level in the intensity levels with a higher frequency of the clock signal that is used to drive the charge pump or a larger total pumping capacitance of the charge pump; and
   if the duty cycle of the charge pump is smaller than at least one minimum threshold, change the current intensity level to a different intensity level in the intensity levels with a lower frequency of the clock signal that is used to drive the charge pump or a smaller total pumping capacitance of the charge pump.

19. An integrated circuit device comprising the control device and the charge pump of claim 11.

20. A method for controlling a charge pump, the method comprising:
   obtaining a plurality of intensity levels of clock frequency settings and capacitance settings of the charge pump, wherein each intensity level comprises a unique combination of a frequency of a clock signal that is used to drive the charge pump and a total pumping capacitance of the charge pump;
   calculating a duty cycle of the charge pump within a time period based on a power-on status of the charge pump;
   if the duty cycle of the charge pump is smaller than at least one minimum threshold, changing an intensity level of a clock frequency setting and a capacitance setting of the charge pump to a different intensity level in the intensity levels with a lower frequency of the clock signal that is used to drive the charge pump or a smaller total pumping capacitance of the charge pump;
   if the duty cycle of the charge pump is larger than at least one maximum threshold, changing the intensity level of the clock frequency setting and the capacitance setting of the charge pump to a different intensity level in the intensity levels with a higher frequency of the clock signal that is used to drive the charge pump or a larger total pumping capacitance of the charge pump; and
   if the duty cycle of the charge pump is smaller than the at least one maximum threshold and larger than the at least one minimum threshold, keeping the intensity level of the clock frequency setting and the capacitance setting of the charge pump the same.

* * * * *